US010603741B2

(12) United States Patent
Bogen et al.

(10) Patent No.: US 10,603,741 B2
(45) Date of Patent: Mar. 31, 2020

(54) APPARATUS FOR THE MATERIAL-BONDED CONNECTION OF CONNECTION PARTNERS OF A POWER-ELECTRONICS COMPONENT

(71) Applicant: Semikron Elektronik GmbH & Co., KG, Nürnberg (DE)

(72) Inventors: Ingo Bogen, Nürnberg (DE); Heiko Braml, Wiesenttal (DE); Christian Göbl, Nürnberg (DE); Ulrich Sagebaum, Feucht (DE); Jürgen Windischmann, Pommersfelden (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 331 days.

(21) Appl. No.: 15/356,655

(22) Filed: Nov. 20, 2016

(65) Prior Publication Data
US 2017/0144246 A1 May 25, 2017

(30) Foreign Application Priority Data
Nov. 20, 2015 (DE) .......................... 10 2015 120 156

(51) Int. Cl.
*B23K 37/00* (2006.01)
*B23K 20/00* (2006.01)
(Continued)

(52) U.S. Cl.
CPC .......... *B23K 20/002* (2013.01); *B23K 20/023* (2013.01); *B23K 20/10* (2013.01);
(Continued)

(58) Field of Classification Search
CPC ........... B23K 20/00–1215; B23K 20/1295–26; H01L 2224/75343; H01L 2224/8384;
(Continued)

(56) References Cited

U.S. PATENT DOCUMENTS 3,612,385 A * 10/1971 Humpage ............ B23K 20/106
156/73.1
3,699,640 A * 10/1972 Cranston ................ B23K 20/02
228/106
(Continued)

FOREIGN PATENT DOCUMENTS

DE 10 2005 058 794 A1 6/2007
DE 10 2007 006 706 A1 8/2008
(Continued)

OTHER PUBLICATIONS

Machine translation of JP 2004-296746A (no date available).*

*Primary Examiner* — Kiley S Stoner
(74) *Attorney, Agent, or Firm* — The Law Offices of Roger S. Thompson

(57) ABSTRACT

A pressing ram having an elastic cushion element and intended for the material-bonded press-sintering connection of a first connection partner to a second connection partner of a power-electronics component. The elastic cushion element of the pressing ram is enclosed by a dimensionally stable frame, within which the cushion element and a guide part of the pressing ram are guided for linear movement such that the dimensionally stable frame lowers onto the first connection partner, or a workpiece carrier with the first connection partner arranged therein, and, following abutment against the same, the pressing ram together with the elastic cushion element is lowered onto the second connection partner and the elastic cushion exerts a pressure necessary for connecting the first connection partner to the second connection partner.

17 Claims, 2 Drawing Sheets

(51) Int. Cl.
    *H01L 23/00* (2006.01)
    *B23K 20/02* (2006.01)
    *B23K 20/10* (2006.01)
    *B23K 20/26* (2006.01)

(52) U.S. Cl.
    CPC .............. *B23K 20/26* (2013.01); *H01L 24/75* (2013.01); *H01L 24/79* (2013.01); *H01L 24/32* (2013.01); *H01L 24/50* (2013.01); *H01L 24/83* (2013.01); *H01L 24/86* (2013.01); *H01L 2224/32227* (2013.01); *H01L 2224/73269* (2013.01); *H01L 2224/7532* (2013.01); *H01L 2224/7598* (2013.01); *H01L 2224/75251* (2013.01); *H01L 2224/75252* (2013.01); *H01L 2224/75314* (2013.01); *H01L 2224/75315* (2013.01); *H01L 2224/75316* (2013.01); *H01L 2224/75343* (2013.01); *H01L 2224/75704* (2013.01); *H01L 2224/7932* (2013.01); *H01L 2224/79251* (2013.01); *H01L 2224/79252* (2013.01); *H01L 2224/79314* (2013.01); *H01L 2224/79316* (2013.01); *H01L 2224/79343* (2013.01); *H01L 2224/8384* (2013.01); *H01L 2224/83203* (2013.01); *H01L 2224/86203* (2013.01)

(58) Field of Classification Search
    CPC . H01L 2224/79343; H01L 2224/75314; H01L 2224/79314; H01L 2224/83203; H01L 2224/86203
    USPC ........ 228/110.1, 1.1, 115, 106, 233.1–235.1, 228/5.5, 6.1, 6.2
    See application file for complete search history.

(56) References Cited

U.S. PATENT DOCUMENTS

| | | | | |
|---|---|---|---|---|
| 3,962,007 | A * | 6/1976 | Heimberger | B29C 65/08 156/73.1 |
| 4,080,229 | A * | 3/1978 | Williams | B29C 65/78 156/543 |
| 4,461,662 | A * | 7/1984 | Onishi | B29C 65/5042 156/157 |
| 4,887,758 | A * | 12/1989 | Suzuki | H01L 21/67138 228/5.1 |
| 5,201,450 | A * | 4/1993 | Ahn | B23K 20/004 219/228 |
| 5,222,649 | A * | 6/1993 | Funari | B23K 1/012 228/180.22 |
| 5,582,341 | A * | 12/1996 | Kanayama | B23K 20/023 228/5.5 |
| 6,142,356 | A * | 11/2000 | Yamazaki | B23K 1/002 228/24 |
| 6,196,439 | B1 * | 3/2001 | Mays | B23K 1/018 228/6.2 |
| 6,244,493 | B1 * | 6/2001 | Shimazaki | B23K 20/26 228/5.5 |
| 6,257,478 | B1 * | 7/2001 | Straub | B23K 1/018 228/119 |
| 6,269,999 | B1 * | 8/2001 | Okazaki | B23K 20/10 228/110.1 |
| 7,556,190 | B2 * | 7/2009 | Matsumura | B30B 5/02 228/180.21 |
| 7,703,657 | B2 * | 4/2010 | Matsumura | B30B 5/02 228/5.5 |
| 7,757,930 | B2 * | 7/2010 | Maki | H01L 21/561 228/180.21 |
| 7,882,997 | B2 * | 2/2011 | Zakel | H01L 24/26 228/44.7 |
| 8,091,764 | B2 * | 1/2012 | Suga | B23K 20/023 228/180.21 |
| 8,209,858 | B2 * | 7/2012 | Speckels | H01L 21/67144 29/834 |
| 8,210,417 | B2 * | 7/2012 | Akiyama | H01L 21/67092 228/44.7 |
| 8,870,051 | B2 * | 10/2014 | Brofman | B23K 31/02 228/5.5 |
| 10,052,713 | B2 * | 8/2018 | Sato | B23K 20/10 |
| 2002/0006765 | A1 * | 1/2002 | Michel | B23K 26/073 451/28 |
| 2007/0131353 | A1 | 6/2007 | Gobl | |
| 2007/0187457 | A1 * | 8/2007 | Minamitani | B23K 20/10 228/1.1 |
| 2009/0032570 | A1 | 2/2009 | Matsumura | |
| 2010/0078463 | A1 * | 4/2010 | Speckels | H01L 21/67092 228/212 |
| 2010/0327043 | A1 * | 12/2010 | Nakamura | H01L 21/563 228/44.3 |
| 2014/0256087 | A1 * | 9/2014 | Liu | H01L 24/03 438/107 |
| 2014/0263575 | A1 * | 9/2014 | Shiratori | H05K 13/0478 228/6.2 |
| 2016/0118362 | A1 * | 4/2016 | Han | H01L 24/75 228/6.2 |
| 2016/0148819 | A1 * | 5/2016 | Heuck | H01L 21/4825 438/121 |
| 2016/0225735 | A1 * | 8/2016 | Heuck | B23K 1/0016 |
| 2017/0144221 | A1 * | 5/2017 | Ghoshal | B22F 3/1017 |
| 2017/0216920 | A1 * | 8/2017 | Osterwald | H01L 24/75 |
| 2017/0229418 | A1 * | 8/2017 | Osterwald | H01L 24/75 |
| 2017/0229424 | A1 * | 8/2017 | Eisele | H01L 24/32 |
| 2018/0114772 | A1 * | 4/2018 | Krusor | H01L 24/27 |

FOREIGN PATENT DOCUMENTS

| | | | | |
|---|---|---|---|---|
| DE | 102015120156 A1 * | 5/2017 | ............ | B23K 20/002 |
| EP | 2 390 904 A2 | 11/2011 | | |
| JP | 2001053113 A * | 2/2001 | ............ | B23K 20/10 |
| JP | 2004- 296 746 A | 10/2004 | | |
| WO | WO-2016050466 A1 * | 4/2016 | ............ | H01L 24/75 |

* cited by examiner

APPARATUS FOR THE MATERIAL-BONDED CONNECTION OF CONNECTION PARTNERS OF A POWER-ELECTRONICS COMPONENT

BACKGROUND OF THE INVENTION

1. Field of the Invention

The invention is directed to an apparatus for the material-bonded connection, in particular pressure-sintering connection, of connection partners of a power-electronics component, in particular of a power-semiconductor module, wherein the apparatus has a pressing ram which has an elastic cushion element.

2. Description of the Related Art

German Patent Application No. DE 10 2007 006 706 A1 discloses a circuit arrangement having a substrate, having conductor tracks arranged on a main surface of said substrate, having at least one semiconductor component arranged with its first main surface on a first conductor track, and having an electrically conductive connecting device to at least one contact surface of the second main surface of the semiconductor component. The connecting device here is designed in the form of a composite film structure made up of at least one metallic film, preferably at least two metallic films and an insulating film arranged between the metallic films.

German Patent Application No. DE 10 2005 058 794 A1 discloses an apparatus and a cyclic method for the pressure-sintering connection of a plurality of chip-form components to conductor tracks of a substrate. For this purpose, the apparatus has a pressing apparatus, a conveying belt and a further apparatus for covering the substrate with a protective film. The pressing apparatus here is suitable for cyclic operation, and has a pressing ram and a heatable pressing table. The conveying belt is sufficiently stable to pressure and is arranged to run directly above the pressing table. The protective film is arranged between the substrate, with the components arranged thereon, and the pressing ram. During the course of the cyclic method, the upper side of the substrate is covered with the protective film and the pressure-sintering operation is then started.

In addition to sintering essentially planar components such as power-semiconductor components, a pressing apparatus which is standard in the art for establishing pressure-sintering connections can also be used for sintering planar-surface connections. The sintering of angled connections is possible only to a limited extent. This results in the geometry of the connection elements being limited. If a plurality of connection partners are present, then these have to be sintered one after the other by the known sinter presses.

SUMMARY OF THE INVENTION

It is an object of the invention is to provide an apparatus of the type mentioned in the introduction which is also suitable for connections of any desired geometry, i.e. even for non-planar connections.

The inventive apparatus is designed with a pressing ram which has an elastic cushion element and is intended for the material-bonded press-sintering connection of a first connection partner to a second connection partner of a power-electronics component. The elastic cushion element of the pressing ram is enclosed by a dimensionally stable frame, within which the cushion element and a guide part of the pressing ram are guided for linear movement such that the dimensionally stable frame lowers onto the first connection partner, or a workpiece carrier with the first connection partner arranged therein, and, following abutment against the same, the pressing ram together with the elastic cushion element is lowered onto the second connection partner and the elastic cushion element exerts a pressure necessary for connecting the first connection partner to the second connection partner.

It is preferred if a suspension arrangement is provided between the pressing ram and the frame. The frame and the pressing ram here are lowered together. When the frame is in abutment, the pressing ram can then be lowered further, wherein the frame is pushed onto the second connection partner, or the workpiece carrier, by means of the suspension arrangement. As an alternative, the pressing ram may have a lowering device which acts independently of the frame. In this case, the frame is lowered onto the second connection partner, or the workpiece carrier, before the pressing ram is lowered onto the second connection partner.

It is advantageous, in principle, if, in the inactive, rest, state of the pressing ram, the end surface of the elastic cushion element is set back slightly in relation to a bearing end periphery of the frame for bearing on the first connection partner. It is possible here for the bearing end periphery of the frame to be generally smooth, and define a generally planar bearing surface.

Guide-column elements can project away from the frame and extend in a movably guided manner through guide holes of the pressing ram.

It is preferred, in principle, if the pressing ram can be heated.

It is standard practice in the art, and preferred, if the pressing ram is combined with a mating ram element, which may be designed in the form of a workpiece carrier, between which the power-electronics component, in particular the first and second connection partners, is/are arranged. It may be preferred if the mating ram element can be heated.

If may further be preferred if the pressing ram and/or the mating ram element can be subjected to ultrasound energy.

It is particularly advantageous if the cushion element consists of silicone and has a Shore A hardness between about 25 and about 100, in particular of between about 50 and about 75. It is further preferred if the silicone is stabilized by metallic additives, in particular iron or iron compounds, in particular iron oxide, and can thus be used at temperatures of more than about 175° C., in particular of more than about 210° C., and pressures between about 10 and about 40 MPa.

In particular this configuration of the cushion element in combination with the frame element causes the pressure to be introduced quasi hydrostatically, since the silicone under pressure exhibits a flow behavior which is comparable with a viscous fluid. This quasi hydrostatic pressure distribution over all the surfaces gives rise to a pressure-sintering connection being established with no adverse effects to the materials involved.

A non-adhering plastic film, in particular a PTFE film, with a thickness between about 25 µm and about 200 µm, in particular between about 50 µm and about 100 µm, is arranged between the cushion element and the power-electronics component preferably during the pressing operation.

The use of the apparatus according to the invention provides for the material-bonded connection, in particular pressure-sintering connection, of at least one substrate to a cooling body and/or of at least one power-semiconductor component to a substrate and/or of at least one connection element to a substrate or a power-semiconductor component and/or of a composite film structure to power-semiconductor components and/or a substrate.

Of course, unless ruled out per se, it is also possible for the features mentioned in the singular to be present in plural form in the switching device according to the invention.

It goes without saying that the various configurations of the invention can be realized individually, or in any desired combinations which are not mutually exclusive, to achieve improvements. In particular the features indicated and explained above and hereinbelow, irrespective of whether they are indicated within the framework of the apparatus or the use thereof, can be used not just in the combinations indicated, but also in other combinations or on their own, without constituting a departure point from the framework of the present invention.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE
PRESENTLY PREFERRED EMBODIMENTS

Figure 1:
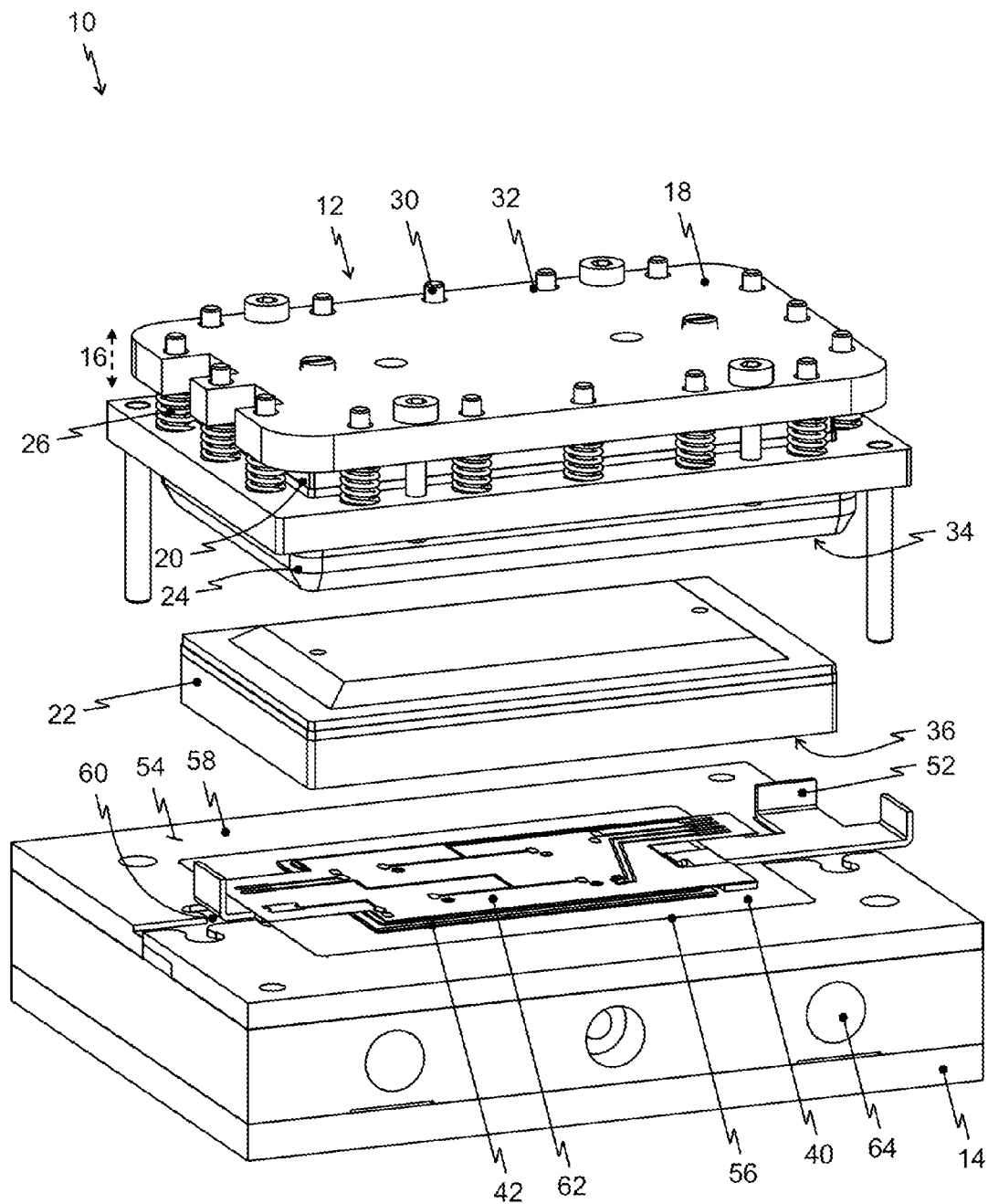
FIG. 1 shows a three-dimensional illustration of a first configuration of an apparatus according to the invention.

FIG. 1 shows a three-dimensional illustration of a first configuration of an apparatus 10 having a pressing ram 12 and a mating ram element 14. Pressing ram 12 can be moved towards the mating ram element 14. This is indicated by the arrow 16.

Pressing ram 12 has a pressing plate 18 and a guide part 20. Guide part 20 may be connected integrally or in a form-fitting and/or force-fitting manner to pressing plate 18.

Pressing ram 12 also has an elastic cushion element 22. Cushion element 22 here has the same cross-sectional surface area as guide part 20 of pressing ram 12.

Elastic cushion element 22 is enclosed by a dimensionally stable frame 24, within which elastic cushion element 22 and guide part 20 of pressing ram 12 are positioned so as to be guided for linear movement.

A suspension arrangement 26 is provided between pressing ram 12 and frame 24, which encloses cushion element 22. The suspension arrangement 26 is formed by helical compression springs, which are provided around guide-column elements 30. Guide-column elements 30 project away from the dimensionally stable frame 24 and extend through guide holes 32, which are formed in pressing plate 18 of pressing ram 12.

Figure 2:
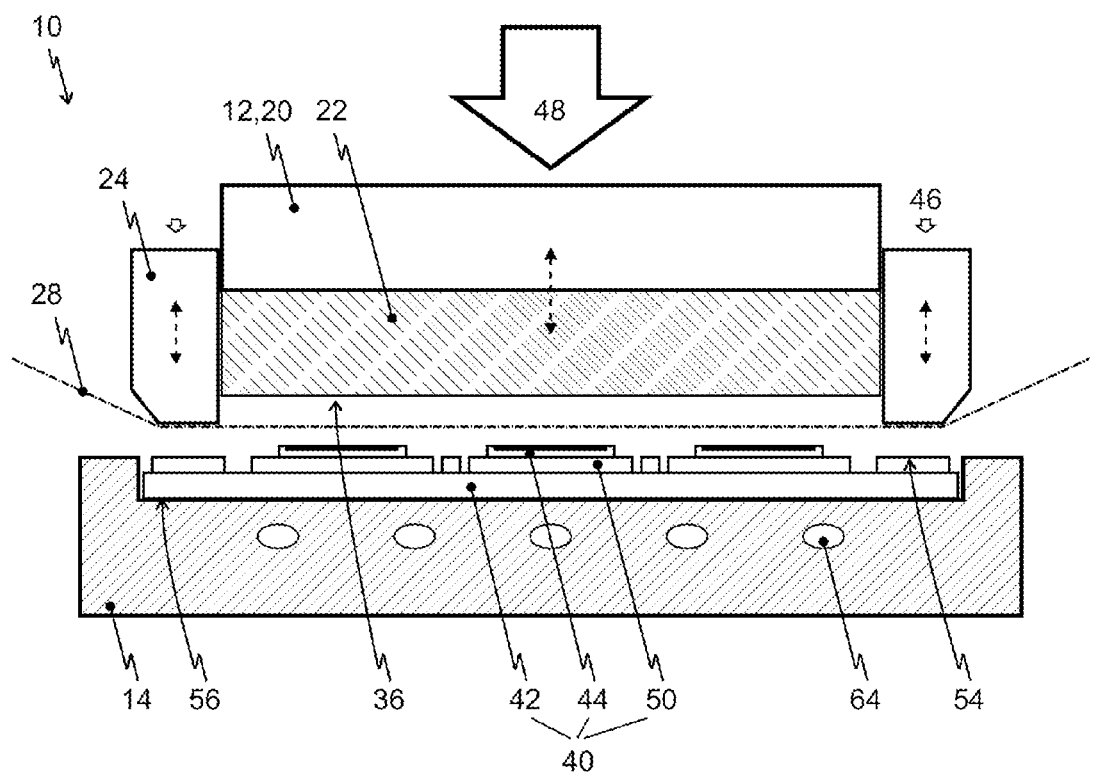
FIGS. 2 and 3 show a simplified illustration of a second configuration of an apparatus according to the invention with two different power-electronics components.
Figure 3:
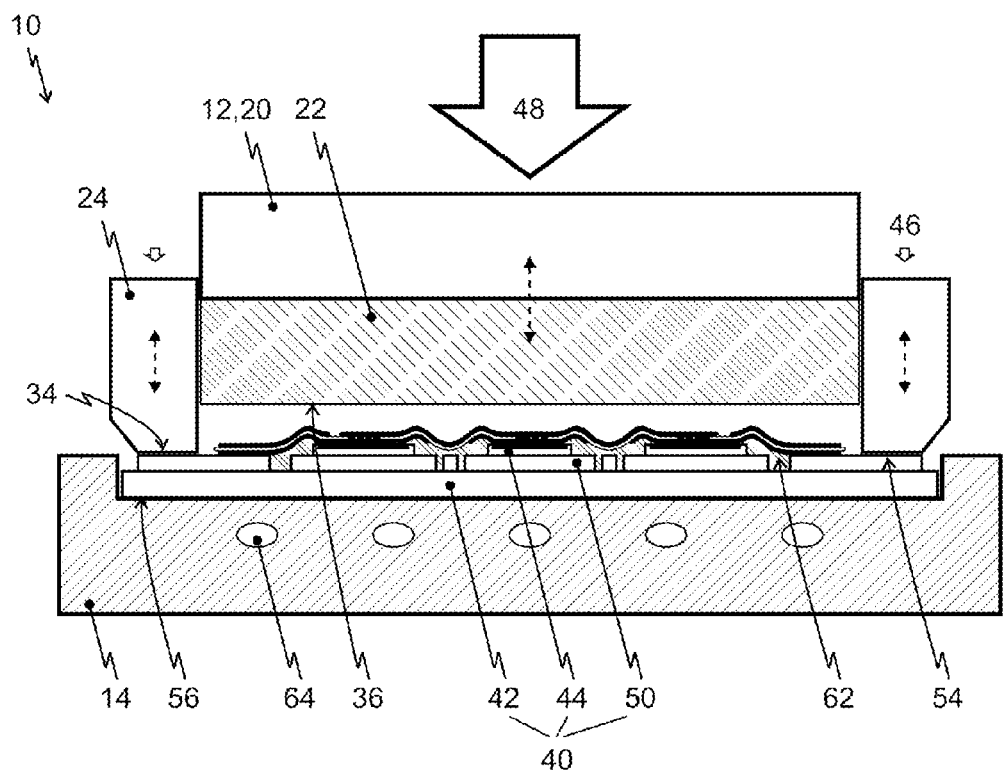

Reference sign 40 denotes a power-electronics component, in particular part of a power-semiconductor module, which has a substrate 42, cf. FIG. 2 or 3, for example a DCB (Direct Copper Bonding) substrate. A circuit-structured metal layer 50 is provided on the one, upper, side of the substrate 42. Power-semiconductor components 44, cf. FIG. 2 or 3, may be provided on circuit-structured metal layer 50. The power-semiconductor components may be connected in an electrically conductive manner, for example, by means of a composite film structure according to FIG. 3.

Reference sign 52 denotes connection elements of the power-electronics component, in particular of power-semiconductor module 40.

Bearing end periphery 34 of dimensionally stable frame 24 may be formed with apertures, through which connection elements 52 extend laterally outwards. Another, preferred option, however, is that bearing end periphery 34 of dimensionally stable frame 24 is generally smooth, i.e. it has no apertures, and defines a generally planar bearing surface. In the case of such a design of the last-mentioned type, mating ram element 14, in this case designed in the form of a workpiece carrier, is expediently combined with a holder 56 for substrate 42 and with frame elements 58, which are provided for temporarily securing substrate 42 and which also define a planar bearing surface 54. Frame elements 58 here are formed with apertures 60 for connection elements 52.

Holder 56 is designed with heating channels 64, so that holder 56 can be heated in order thus to connect the different connection partners, as have been explained above by way of example, to one another in an electrically conductive manner by pressure sintering in a single method step.

FIGS. 2 and 3 show a simplified illustration of a second configuration of an apparatus 10 according to the invention having two different power-electronics components.

These figures illustrate a workpiece carrier, or in general terms a mating ram element 14, in holder 56 of which is positioned a power-electronics component 40, in this case a substrate 42 of a power-semiconductor module. On its second side, which is directed away from the workpiece carrier, substrate 42 has a structured metal layer 50. The latter forms the conductor tracks of the power-semiconductor module. Power-semiconductor components 44 are arranged on the conductor tracks.

Substrate 42 forms, and more precisely the conductor tracks thereof form, the first connection partner which is to be connected to the second connection partner—the power-semiconductor components 44—by means of a pressure-sintering connection. For this purpose, the connection partners have sinterable connecting surfaces. In addition, a layer of a sintering metal in the unsintered state (not illustrated) is arranged between the connection partners or the connecting surfaces thereof.

FIG. 2 also illustrates a dimensionally stable frame 24, which can be lowered onto the first connection partner, in this case substrate 42, wherein in this case the pressure 46 on substrate is several orders of magnitude below the pressure 48 for forming the sintering connection, this being illustrated by the different sizes of the arrows representing the pressure. A plastic film 28, in this case a PTFE film, which does not adhere to the power-electronics component 40 and has a thickness of approximately 60 μm is arranged here on the surface of substrate 42 together with power-semiconductor components 44. As soon as frame 24 rests on substrate 42, pressing ram 12 together with cushion element 22 can be lowered and the pressure which is necessary for forming the pressure-sintering connection to the second connection partner, and in this embodiment is approximately 25 MPa, can be introduced. In the meantime, the workpiece carrier and therefore substrate 42 and the power-semiconductor components 44 have been heated to approximately 210° C., which serves to establish the pressure-sintering connection quickly.

Cushion element 22 here is designed in the form of a silicone cushion with a Shore A hardness of approximately 55, the silicone cushion being stabilized by the addition of iron and/or iron oxide. The frame here serves to delimit laterally that space in which the silicone cushion exerts the quasi hydrostatic pressure over all its surfaces.

FIG. 3 shows, as part of a power-electronics component 40, a substrate 42 with conductor tracks and power-semiconductor components 44. The latter should be connected to one another, and to the conductor tracks, in terms of circuitry by means of a composite film structure 62 which is standard in the art. The second configuration of the apparatus 10 is illustrated here in a phase of use in which frame 24 has already been lowered onto substrate 42 and, in a next step, pressing ram 12 together with cushion element 22 will be lowered. The PTFE film which is also preferred here, cf. FIG. 2, has not been illustrated in FIG. 3.

Connection of composite film structure 62 to substrate 42 or power-semiconductor components 44 takes place, in principle, as described above in the case of FIG. 2 for power-semiconductor components 44. It is additionally the case here, in a manner which is preferred, but not generally necessary, that a protective layer is arranged beneath composite film structure 62, enclosing power-semiconductor components 44.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. Apparatus for the material-bonded connection of connection partners of a power-electronics component, the apparatus comprising:
a pressing ram having an elastic cushion element, for the material-bonded press-sintering connection of a first connection partner to a second connection partner of the power-electronics component, said pressing ram also having a guide part and guide holes;
a dimensionally stable frame which encloses said elastic cushion element;
a suspension arrangement positioned between said pressing ram and said frame; and
guide-column elements which project away from said frame and extend in a movably guided manner through said guide holes of said pressing ram;
wherein said elastic cushion element and said guide part of said pressing ram are guided for linear movement within said frame such that said frame lowers onto said first connection partner, and, following abutment against the same, said pressing ram together with said elastic cushion element is lowered onto said second connection partner;
whereby said elastic cushion element exerts the pressure necessary for connecting said first connection partner to said second connection partner.

2. The apparatus of claim 1, wherein said pressing ram further includes a lowering device which acts independently of said frame.

3. The apparatus of claim 1, wherein said pressing ram has an inactive state in which an end surface of said elastic cushion element is set back slightly in relation to a bearing end periphery of said frame for bearing on said first connection partner.

4. The apparatus of claim 3, wherein said bearing end periphery of said frame is generally smooth, and defines a generally planar bearing surface.

5. The apparatus of claim 1, further comprising:
means for heating said pressing ram.

6. The apparatus of claim 1, further comprising:
a mating ram element positioned so that at least a portion of the power-electronics component is arranged between said pressing ram and said mating ram element.

7. The apparatus of claim 6, further comprising:
means for heating said mating ram element.

8. Apparatus for the material-bonded connection of connection partners of a power-electronics component, the apparatus comprising:
a pressing ram having an elastic cushion element, for the material-bonded press-sintering connection of a first connection partner to a second connection partner of the power-electronics component, said pressing ram also having a guide part;
a dimensionally stable frame which encloses said elastic cushion element; and
a suspension arrangement positioned between said pressing ram and said frame;
wherein said elastic cushion element and said guide part of said pressing ram are guided for linear movement within said frame such that said frame lowers onto said first connection partner, and, following abutment against the same, said pressing ram together with said elastic cushion element is lowered onto said second connection partner;
whereby said elastic cushion element exerts the pressure necessary for connecting said first connection partner to said second connection partner;
wherein said elastic cushion element consists of silicone and has a Shore A hardness of between about 25 and about 100; and
wherein said silicone is stabilized by metallic additives and can thus be used at temperatures of more than about 175° C. and pressures between about 10 and about 40 MPa.

9. The apparatus of claim 8, wherein said silicone has a Shore A hardness of between about 50 and about 75.

10. The apparatus of claim 8, wherein said metallic additives include one of iron and iron compounds.

11. The apparatus of claim 10, wherein said metallic additives include iron oxide, and thus said silicone can be used at temperatures of more than about 210° C.

12. The apparatus of claim 1, further comprising:
a non-adhering plastic film with a thickness between about 25 μm and about 200 μm, arranged between said cushion element and the power-electronics component during the pressing operation.

13. The apparatus of claim 12, wherein said non-adhering plastic film is a PTFE film.

14. The apparatus of claim 12, wherein said thickness of said non-adhering plastic film, is between about 50 μm and about 100 μm.

15. The apparatus of claim 6, wherein the portion of the power-electronics component which is arranged between said pressing ram and said mating ram element is at least one of said first and second connection partners.

16. The apparatus of claim 1, wherein said elastic cushion element consists of silicone and has a Shore A hardness of between about 25 and about 100.

17. The apparatus of claim 16, wherein said silicone has a Shore A hardness of between about 50 and about 75.

* * * * *